United States Patent [19]

Laughton

[11] Patent Number: 4,578,632
[45] Date of Patent: Mar. 25, 1986

[54] INTERGRATABLE LOAD VOLTAGE SAMPLING CIRCUIT FOR R.M.S. LOAD AVERAGE VOLTAGE CONTROL APPARATUS

[75] Inventor: William J. Laughton, Schenectady, N.Y.

[73] Assignee: General Electric Company, Schenectady, N.Y.

[21] Appl. No.: 608,043

[22] Filed: May 7, 1984

[51] Int. Cl.$^4$ ............................................. G05F 1/56
[52] U.S. Cl. ................................. 323/315; 323/281; 323/237
[58] Field of Search ........ 323/315, 316, 317, 312–314, 323/200, 223, 237, 280, 281, 323; 330/288

[56] References Cited

U.S. PATENT DOCUMENTS

| | | | |
|---|---|---|---|
| 4,063,149 | 12/1977 | Crowle | 323/315 |
| 4,435,678 | 3/1984 | Joseph et al. | 323/315 X |
| 4,477,737 | 10/1984 | Ulmer et al. | 323/316 X |
| 4,498,041 | 2/1985 | Kuwahara | 323/316 |
| 4,513,178 | 4/1985 | Hing et al. | 323/316 X |
| 4,528,494 | 7/1985 | Bloomer | 323/237 |

*Primary Examiner*—Philip H. Leung
*Attorney, Agent, or Firm*—Geoffrey H. Krauss; James C. Davis, Jr.; Marvin Snyder

[57] ABSTRACT

An integratable load voltage sampling circuit utilizes a plurality of current-mirrors. One of the current mirrors is switched into conduction during a load-current conduction time interval, while another current mirror operates during the entire source half-cycle during which the first current mirror is pulsed to conduct. The total current from the plurality of current mirrors is summed and compared to a reference level; the difference in magnitude between the sampled and reference values is integrated, with respect to time, to provide a load conduction-angle adjustment signal having a magnitude varying as the root-mean-square magnitude of the average load voltage.

20 Claims, 6 Drawing Figures

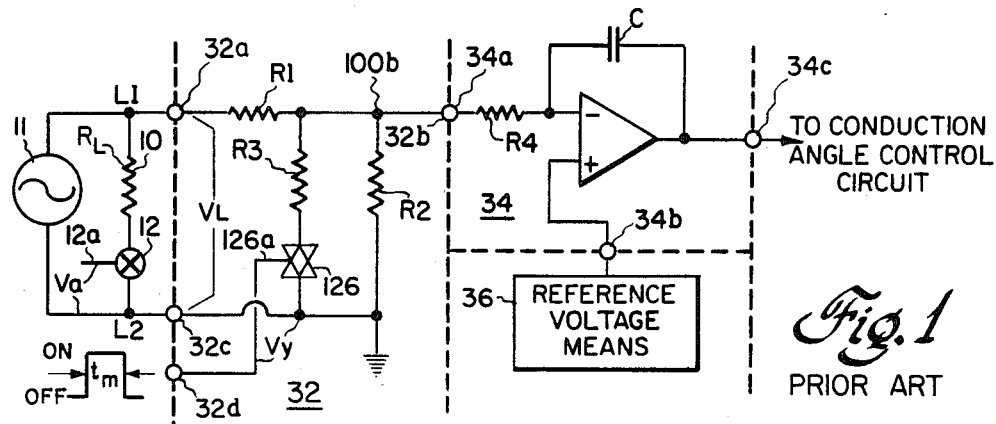
Fig.1 PRIOR ART
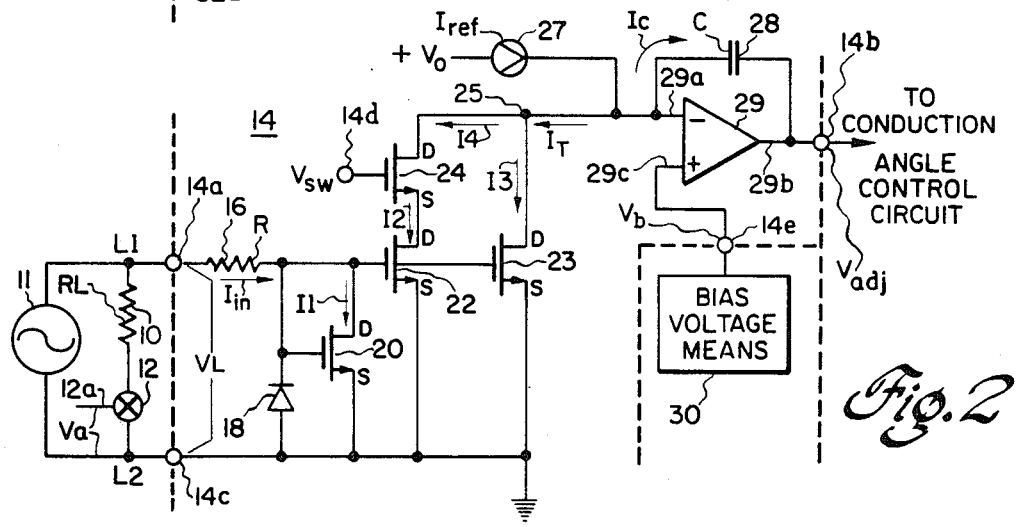
Fig.2
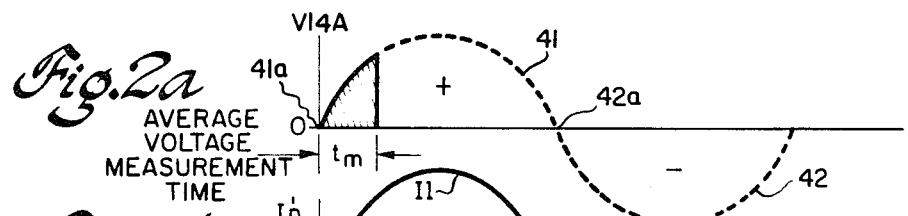
Fig.2a AVERAGE VOLTAGE MEASUREMENT TIME
Fig.2b
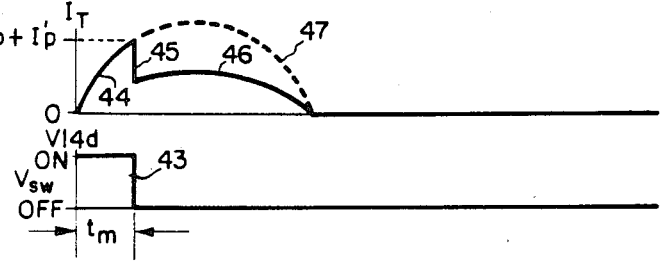
Fig.2c
Fig.2d

4,578,632

INTERGRATABLE LOAD VOLTAGE SAMPLING CIRCUIT FOR R.M.S. LOAD AVERAGE VOLTAGE CONTROL APPARATUS

BACKGROUND OF THE INVENTION

The present invention relates to load power switching circuits and, more particularly, to novel integratable load voltage sampling circuitry for apparatus controlling the R.M.S. magnitude of an A.C. voltage across a load.

It is known to control the magnitude of a current flowing through a load from an A.C. source by means of a phase-control circuit, utilizing either forward-phase control or reverse-phase control (the latter as described and claimed in co-pending application Ser. No. 529,296, filed on Sept. 6, 1983, now U.S. Pat. No. 4,528,494, issued July 9, 1985 assignee of the present application and incorporated herein in its entirety by reference). In many uses, open-loop control of the load voltage magnitude, and therefore of the load power, is adequate. In many other uses, e.g. a line voltage converter for energizing lower voltage incandescent lamps, closed-loop control of the load (lamp) voltage magnitude, and therefore of the load power, is desirable. It is also desirable that any load voltage magnitude control apparatus (controlling the "average", i.e. root-mean-square (R.M.S.), magnitude) be utilizable with any switched-voltage or phase-control (whether forward-control or reverse-control) voltage converter and also be equally as well suited for use with power switching devices, placed in series between the controlled load and an A.C. source, of regenerative or controlled-turn-off types. It is also highly desirable that any load voltage magnitude control apparatus be capable of operating in conjunction with load current control means, such as the reverse-phase load current control means of the aforementioned co-pending application, which provides load control during the high "inrush" current magnitude initial interval when a "cold" load is first energized. One such average load voltage control means is described and claimed in allowed co-pending application Ser. No. 561,494, filed Dec. 14, 1983, by Milton D. Bloomer, assigned to the assignee of the present application and incorporated herein in its entirety by reference. Bloomer's apparatus uses a load voltage sampling means which requires a plurality of fixed-value resistors each of which must be maintained fairly closely in absolute and relative value. His circuit is thus neither easily implementable in completely integrated circuit form nor is such a circuit capable of an implementation at as low a cost as can be desired. A lower-cost, completely-integratable load voltage sampling circuit is therefore highly desirable.

BRIEF SUMMARY OF THE INVENTION

In accordance with the invention, an integratable load voltage sampling means is provided for sampling the magnitude of the voltage across a load during at least one of the time intervals when load current flows during a source waveform cycle. The sampled load voltage is converted to a current used to set the output current of a current mirror. The output current, which varies as the R.M.S. magnitude of the load voltage, is compared to a reference level and the difference in magnitude between the sampled and reference values is integrated, with respect to time, to provide a conduction-angle adjustment signal.

In presently preferred embodiments, the sampling means is controlled by only one sampling signal. The sensor requires only a single resistance element. The sensing circuit output current magnitude is established by the ratios of channel width-to-length in a plurality of field-effect transistors (FETs) used in the current mirror and by the value of the single resistor, whereby simple trimming of only the one resistor is necessary for adjustment of an integrated circuit for load voltage control.

Accordingly, it is an object of the present invention to provide a novel integratable load voltage sensing circuit for apparatus for controlling the magnitude of the R.M.S. voltage across a load connected to an A.C. source.

This and other objects of the present invention will become apparent upon consideration of the following detailed description, when read in conjunction with the drawings.

BRIEF SUMMARY OF THE DRAWINGS

FIG. 1 is a schematic block diagram of a prior art load voltage sensor for use in control apparatus;

FIG. 2 is a schematic diagram of a presently preferred embodiment of the integratable load sensing circuit of the present invention for sensing R.M.S. load voltage magnitude; and FIGS. 2a–2d are a set of time-coordinated graphs of several waveforms observable in the circuit of FIG. 2, and useful in understanding principles of operation thereof.

DETAILED DESCRIPTION OF THE INVENTION

Referring initially to FIG. 1, a prior art load voltage sampling circuit 32 (using the reference designations of the aforementioned application Ser. No. 561,494) is, as more fully described and claimed in that co-pending application, connected to sample the voltage $V_L$ at terminal 32a and across a load resistance 10, during specified-polarity, e.g. positive polarity, half-cycles of an A.C. source 11 voltage waveform, when switching means 12 is closed responsive to a control signal $V_a$ appearing between switch input 12a and circuit common potential at terminal 32c. A sample of the (line L1-to-circuit common) potential $V_L$ is provided at a sensing circuit output 32b only if a high, logic 1, level of a sample control signal is present at a control input 32d. A sensed R.M.S. magnitude will be provided if the control input 126a voltage $V_y$ (at circuit input 32d) is used to control the sample time interval $t_m$. The root-mean-square (R.M.S.) value of the load voltage sampled by means 32 is provided as a signal at the output 32b and is coupled to a load voltage sample input 34a of a differential voltage integrating means 34. A reference potential $V_{ref}$ is provided by means 36 to a second input 34b of the differential integrating means. The signal at an output 34c thereof varies in magnitude as the integral, with time, of the difference between the sample voltage $V_s$ and the reference voltage $V_{ref}$. The adjustment voltage output at terminal 34c is provided as a load control signal to a subsequent conduction angle control circuit (not shown).

As long as the load voltage sample signal $V_s$ at sampling means output 32b is equal in magnitude to the reference voltage magnitude at integrating means input 34b, the conduction angle control circuit adjustment voltage provided at output 34c does not affect the turning on and off of power switching means 12. If means 32 samples a load voltage less than the desired magnitude, which desired magnitude is set by the magnitude of the reference voltage at integrating means input 34b, the magnitude of the adjustment voltage increases, causing the switching means 12 to be enabled for a longer time interval to increase the R.M.S. load voltage $V_L$ magnitude. Conversely, if load voltage sampling means 32 senses a load voltage greater than the desired value set by the reference voltage at integrating means input 34b, the magnitude of the adjustment voltage at output 34c decreases, to decrease the time interval during which switching means 12 is enabled; power switching means 12 is thus caused to break the current-conduction path after a shorter time interval, reducing the R.M.S. magnitude of the voltage $V_L$ across load 10.

It will be seen that the sensor of FIG. 1 not only requires four resistance elements, R1–R4, but also requires that each of these four resistive elements be provided with relatively high absolute accuracy, as well as having the ratio of resistance elements R2/R1 and R3/R2 also provided with relatively high accuracy. This multiplicity of resistive elements provides a circuit which is difficult to easily integrate, and also provides a configuration in which trimming of any one of resistive elements R1–R3 does not solely establish a particular load parameter to be sensed. Rather, trimming of any one of resistive elements R1–R3 may require trimming of at least one, and typically both, of the remaining resistance elements of means 32. This results in a cost, for this prior art embodiment, which is greater than desirable.

Referring now to FIG. 2, my novel integratable load voltage sampling circuit 14 provides for root-mean-square (R.M.S.) load voltage magnitude sensing to provide subsequent conduction-angle control circuitry with the same control signal as provided by the prior art circuit of FIG. 1, responsive to the same input control signal, but utilizes only a single resistive element 16, which may be easily trimmed to independently establish an input control parameter. Integratable load voltage sampling circuit 14 has the cathode of a protection diode 18 coupled to that terminal of an input resistor 16 furthest from a line 1 input terminal 14a. The anode of diode 18 is coupled to a circuit common potential terminal 14c, to which the line 2 terminal of source 11 is to be coupled. The gate and drain terminals of a first field-effect transistor (FET) 20 are connected to the junction between resistor 16 and diode 18, with the source electrode of FET 20 connected to circuit common potential at terminal 14c. The channel width-to-channel length ratio of FET 20 is made sufficiently large so that only a small voltage, on the order of 2 volts, is dropped across the drain-source controlled-conduction channel of the conducting FET 20. Therefore, practically the entire line voltage $V_L$, between terminals 14a and 14c, appears across resistor 16. For a typical 120 volt R.M.S. AC source 11, the peak value of this voltage is on the order of 170 volts. Thus, during each positive-polarity polarity half-cycle portion 41 of the source line voltage waveform, diode 18 is reverse-biased and the input current $I_{in}$ is very nearly equal to $V_L/R$, where R is the resistance of resistor 16. This current flows through first FET 20 as current I1. During the negative-polarity half-cycle portion 42 of the source voltage waveform, FET 20 is reverse biased (i.e. I1 is essentially of zero magnitude), and diode 18 is forward biased to clamp the negative-polarity gate-source voltage on FET 20 substantially to circuit common potential, preventing voltage breakdown of FET 20.

FET 20 forms a first current-mirror means with a second FET 22 and a second current-mirror means with a third FET 23. The gate electrodes of both FETs 22 and 23 are connected to the gate-drain electrodes of FET 20, while the source S electrodes of both FETs 22 and 23 are connected to circuit common potential terminal 14c. The drain D electrode of FET 22 is connected to the source electrode of a fourth FET 24, having its gate electrode connected to a switching voltage input terminal 14d, at which switching voltage $V_{SW}$ is provided. The drain D electrode of each of FETs 23 and 24 is connected to a common node 25. The threshold voltages and other device parameters of FETs 20, 22 and 23 are very closely matched, as by fabrication of these three devices in the same substrate utilizing the same fabrication processes. The ratios of the controlled-conduction channel width $W_{c22}$ or $W_{c23}$ and the channel length $L_{c22}$ or $L_{c23}$, respectively, of FETs 22 and 23 as well as the ratio of the controlled-conduction channel width $W_{c20}$ and length $L_{c20}$ of FET 20, are established to have a predetermined relationship such that the ratio of channel width-to-length of devices 22 and 23 to the channel width-to-length ratio of device 20 establishes the magnitude of respective current I2 or I3 respectively flowing into the drain electrode of respective FETs 22 or 23 responsive to the current $I1 = I_{in}$. It will be seen that current I2 flows only if FET 24 is switched into saturation, whereby current I4, leaving node 25, is essentially equal to current I2, flowing through FET 22. A substantially-constant-current $I_{ref}$ is provided to node 25 by a reference current source means 27.

As shown in FIG. 2b, current $I1 = I_{in}$ is present during the entire positive-polarity source waveform half-cycle portion 41. Device 23 drain current I3 is also present during the entire positive-polarity source waveform half-cycle portion. Current $I4 = I2$ is present only when an "on" level of the voltage at terminal 14d (FIG. 2d) is present in a measurement time interval $t_m$, immediately following the zero crossing 41a of the line voltage waveform at the beginning of the positive-polarity half-cycle portion. Thus, current $I2 = I4$ has an increasing sinusoidal portion during time interval $t_m$, as shown in FIG. 2b, and falls to a substantially-zero magnitude when device 24 is switched to the cut-off condition at the end of this time interval. For purposes of illustration only, the channel width-to-length ratios of device 22 and of device 23 have respectively been shown as being related to the channel width-to-length ratio of device 20 such that device 23 drain current I3 is one-half the device 20 input current I1, and the device 22 current I2 is three-quarters the device 20 input current I1. Thus, at the start of measurement interval $t_m$ i.e. at the positive-going zero crossing 41a of the voltage $V_L$ waveform, both the I3 and I4 waveforms begin at a substantially-zero magnitude and sinusoidally increase to respective magnitudes $I_p$ (e.g. I1/2) and $I_p'$ (e.g. 3I1/4) at the end of measurement time interval $t_M$. Therefore, the total current $I_T$ flowing into node 25 has, as shown in FIG. 2c, a first, sinusoidally-increasing portion 44, beginning at a substantially-zero magnitude at the positive-going zero-crossing point 41a and increasing to a peak magnitude of $I_p + I_p'$ (e.g. 5I1/4), at the end of measurement interval $t_m$. The total current-mirror current $I_T$ abruptly falls, with falling edge 45, at the end of the measurement interval "on" pulse 43 (e.g. to about the $I_p$ magnitude, e.g. about I1/2) and thereafter continues with a portion 46 which follows the sinusoidal I3 current portion of device 23, which conducts during the entire positive-polarity source waveform half-cycle portion 41. The current-mirror means total current $I_T$ waveform falls to the substantially-zero magnitude at the negative-going zero-crossing point 42a and remains at the substantially-zero magnitude level during all of the negative-polarity source waveform half-cycle portion 42. Thus, the switching action of FET 24 prevents the total current $I_T$ from following the broken curve portion 47 during the latter portion of the positive-polarity half-cycle portion 41. The R.M.S. magnitude of the total current-mirror means current $I_T$ is thus established by the duration of measurement time interval $t_m$ pulse 43, which is derived from the signal $V_a$ utilized to enable conduction through load-current switching means 12. Therefore, the duration of measurement pulse 43 is equal to the conduction time of load switching device 12. For example, if load 10 were a 36 volt lamp operating from the 120 volt L1–L2 voltage, the measurement time $t_m$ (equal to the load-current conduction time interval) would be approximately 45° of each 60 Hz. cycle; the conduction angle is established by circuitry similar to that disclosed and claimed in the aforementioned patent application. The particular switching voltage $V_{SW}$ pulse 43 appears at terminal 62-3 shown in the copending application. The device 23 drain current I3 compensates for the R.M.S.-to-average voltage measurement error typically encountered when measuring average voltage for a phase-controlled load over a line-to-line voltage variational range, such as the typical 108 to 132 volts minimum-to-maximum line voltage range typically encountered in the United States.

The total current-mirror means current $I_T$ is effectively subtracted from the reference current $I_{ref}$ current of current source means 27 to provide a current $I_c$ for a subsequent integrator. The reference current may be set, by well-known means for circuit 14 fabricated in discrete, hybrid or integrated circuit form, to establish the load 10 operating point. The algebraic difference between the source 27 current $I_{ref}$ and the current-mirror means total current $I_T$ is the remaining current $I_c$ which must flow through integration capacitor 28, connected between the inverting - input 29a and the output 29b of an operational amplifier 29. The operational-amplifier output 29b is connected to the sensing circuit output terminal 14b, while the operational amplifier non-inverting+input 29c is connected to the sensing circuit bias voltage input terminal 14e, itself connected to a bias voltage providing means 30. Means 30 provides bias voltage $V_b$ at terminal 14e and input 29c, whereby a similar voltage $V_b$ must be present at remaining operational amplifier input 29a, due to the relatively high gain of the operational amplifier 29. The difference between the current source reference current and the current-mirror means total current thus causes the capacitor 28 to charge and operates to change the voltage at circuit output 14b to provide the subsequent conduction angle control circuit with a proper sensor signal $V_{adj}$ for adjusting the load voltage. Illustratively, assume that the total current-mirror means current $I_T$ is greater than the current source reference current $I_{ref}$. There is, thus, a net current flow out of integration capacitor 28, in a direction opposite to the illustrated direction of charging current $I_c$. This current must flow through integration capacitor 28 in the direction from the operational amplifier output 29b to the operational amplifier input 29a. Since input 29a is essentially fixed at bias voltage $V_b$, the amplified output 29b voltage must become increasingly positive, providing an increasingly-positive adjustment voltage $V_{adj}$ to the subsequent conduction angle circuit. Since the current-mirror means total current IT was larger than expected, indicative of a larger-than-desired R.M.S. load voltage $V_L$, the increasingly-positive adjustment voltage signal at terminal 14b is utilized by the subsequent conduction angle control circuit to reduce the conduction time $t_M$ of switch means 12 and thus reduce the load 10 voltage $V_L$. Similarly, if a less-than-desired R.M.S. load voltage is present, the magnitude of the adjustment voltage decreases at terminal 14b and causes an increase in conduction time $t_m$, to increase the load voltage during subsequent source waveform cycles. It will be seen that in a closed-loop system at equilibrium, there will be no net change in the current $I_c$ flowing through integration capacitor 28, as the total current-mirror means current $I_T$ will essentially equal the current source 27 substantially-constant current $I_{ref}$ (which was, as previously described hereinabove, set to establish a load equilibrium R.M.S. voltage). Because the integration capacitor current $I_c$ magnitude does not change, there is no net cycle-to-cycle change in the load voltage sensor output 14b signal. It will also be seen that load voltage-sensing-circuit 14 can be completely integrated with low-cost CMOS technology, and that such a fully integrated circuit implementation can be trimmed for a particular value of load R.M.S. voltage by selection of the magnitudes of either the reference source 27 current or the input resistance element 16 resistance R. Illustratively, only the resistance R of input resistor element 16 would be trimmed to achieve the desired load R.M.S. voltage, and the circuitry utilized for setting the reference current of source means 27 is optimized for desired performance relative to other variable parameters, such as temperature range and the like.

While one presently preferred embodiment of my novel integratable load voltage sampling circuit for R.M.S. load average voltage control apparatus has been described in detail herein, many modifications and variations will now become apparent to those skilled in the art. It is my intent, therefore, to be limited only by the scope of the appending claims, and not by way of the implementations set forth by way of illustration herein.

What I claim is:

1. An integratable sampling circuit for providing to a control circuit an output signal responsive to the magnitude of the R.M.S. average voltage across a load, which load is connected across an AC source during a portion of the periodic waveform of said source, by conduction of a power switching means responsive to a signal from said control circuit, said sampling circuit comprising:

means for receiving from said control circuit a switching signal having a first level only when said power switching means conducts;

means for converting the instantaneous load voltage magnitude to an input current magnitude;

first current-mirror means for providing a first current at a first fixed multiple of said input current, only during the presence of said first level of said switching signal at said receiving means;

second current-mirror means for providing a second current at a second fixed multiple of said input current;

means for providing a substantially-constant reference current; and means for integrating, with respect to time, the difference between said reference current and the total of said first and second currents, to provide said output signal.

2. The sampling circuit of claim 1, further comprising means for preventing operation of said first and second current-mirror means during a predetermined half-cycle polarity portion of said source waveform.

3. The sampling circuit of claim 2, wherein said preventing means is a unidirectionally-conducting element coupled to said converting means.

4. The sampling circuit of claim 2, wherein said R.M.S. load voltage mangitude is variably responsive to a variation in said converting means.

5. The sampling circuit of claim 4, wherein said converting means comprises: a resistive element.

6. The sampling circuit of claim 5, wherein said resistive element has a resistance magnitude predeterminately selected to provide said input current magnitude at a preselected value for a preselected value of said R.M.S. voltage across said load.

7. The sampling circuit of claim 5, wherein said preventing means is a unidirectionally-conducting element coupled in series with said resistance element across said source.

8. The sampling circuit of claim 1, wherein said integrating means comprises: means for providing a bias voltage; an operational amplifier having a first input receiving said difference current, a second input receiving said bias voltage, and an output at which said output signal appears; and an integrating element connected between said operational amplifier first input and output for integrating, with respect to time, said difference current to provide said output signal.

9. The sampling circuit of claim 8, wherein said integrating element is an integration capacitor.

10. The sampling circuit of claim 1, wherein said first and second current-mirror means each share a common first semiconductor device.

11. The sampling circuit of claim 10, wherein said first device is a first field-effect transistor (FET).

12. The sampling circuit of claim 11, wherein the gate and drain electrodes of said first FET are both connected to said converting means.

13. The sampling circuit of claim 11, wherein said first current-mirror means further comprises: a second field-effect transistor (FET) having a gate electrode connected to said first FET and having a controlled-conduction circuit through which said first current flows responsive to the voltage at said gate electrode.

14. The sampling circuit of claim 13, wherein each of said first and second FETs each have a controlled-conduction channel width-to-length ratio; the ratios of said first and second FETs being selected to establish said first fixed multiple.

15. The sampling circuit of claim 14, wherein said fixed multiple is less than 1.

16. The sampling circuit of claim 14, wherein said second fixed multiple is less than 1.

17. The sampling circuit of claim 13, wherein said first current-mirror means further comprises: another field-effect transistor (FET) having a gate electrode receiving said sample signal and having a controlled-conduction circuit effectively in series with the controlled-conduction circuit of said second FET to switch said first fixed multiple of said input current respectively on and off responsive to the respective presence and absence of said switching signal at said electrode of said another FET.

18. The sampling circuit of claim 13, wherein each of said first and third FETs each have a controlled-conduction channel width-to-length ratio; the ratios of said first and third FETs being selected to establish said second fixed multiple.

19. The sampling circuit of claim 11, wherein said second current-mirror means further comprises: a third field-effect transistor (FET) having a gate electrode connected to said first FET and having a controlled-conduction circuit through which said second current flows responsive to the voltage at said gate electrode.

20. The sampling circuit of claim 1, wherein all of said receiving, converting, first and second current-mirror, reference current providing and integrating means are integrated into at least part of a single monolithic integrated circuit.

* * * * *